US009412445B1

(12) United States Patent
Chen et al.

(10) Patent No.: US 9,412,445 B1
(45) Date of Patent: Aug. 9, 2016

(54) RESISTIVE MEMORY APPARATUS AND READING METHOD THEREOF

(71) Applicant: Winbond Electronics Corp., Taichung (TW)

(72) Inventors: Frederick Chen, Hsinchu County (TW); Meng-Hung Lin, Taichung (TW); Ping-Kun Wang, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/824,081

(22) Filed: Aug. 12, 2015

(51) Int. Cl.
G11C 11/00 (2006.01)
G11C 13/00 (2006.01)
G11C 29/50 (2006.01)
G11C 29/04 (2006.01)

(52) U.S. Cl.
CPC .......... *G11C 13/004* (2013.01); *G11C 13/0004* (2013.01); *G11C 13/0035* (2013.01); *G11C 13/0069* (2013.01); *G11C 29/04* (2013.01); *G11C 29/50* (2013.01)

(58) Field of Classification Search
CPC ............. G11C 13/004; G11C 13/0004; G11C 13/0069; G11C 13/0035; G11C 13/0002; G11C 11/5678; G11C 29/04; G11C 29/50; G11C 2213/77
USPC .......... 365/148, 100, 163, 189.07, 171, 210.1
See application file for complete search history.

(56) References Cited

U.S. PATENT DOCUMENTS

| 6,868,025 | B2 | 3/2005 | Hsu | |
| 7,884,349 | B2 * | 2/2011 | Rinerson | G11C 11/5685 257/5 |
| 8,184,491 | B2 | 5/2012 | Chen | |
| 8,559,218 | B2 | 10/2013 | Porter et al. | |
| 8,634,225 | B2 * | 1/2014 | Kang | G11C 13/0004 365/148 |
| 8,745,452 | B2 * | 6/2014 | Oh | G11C 8/10 365/148 |
| 8,773,892 | B2 * | 7/2014 | Kang | G11C 13/0004 365/148 |
| 9,171,617 | B1 * | 10/2015 | Park | G11C 13/0069 |
| 9,183,932 | B1 * | 11/2015 | Kwon | G11C 13/0069 |
| 2016/0125942 | A1 * | 5/2016 | Yoon | G11C 13/0069 365/148 |

FOREIGN PATENT DOCUMENTS

TW    I433153    4/2014

* cited by examiner

Primary Examiner — Gene Auduong
(74) Attorney, Agent, or Firm — Jianq Chyun IP Office

(57) ABSTRACT

A resistive memory apparatus and a reading method thereof are provided. In this method, two reading pulses are applied to a resistive memory cell, such that a first reading resistance and a second reading resistance of the resistive memory cell at different temperatures are sequentially obtained. Next, a resistive state of the second reading resistance is determined according to the reading resistances and the temperatures corresponding to the reading resistances. Thereafter, a logic level of storage data of the resistive memory cell is determined according to the resistive state of the second reading resistance.

14 Claims, 2 Drawing Sheets

RESISTIVE MEMORY APPARATUS AND READING METHOD THEREOF

BACKGROUND

1. Field of the Invention

The invention relates to a memory apparatus and a reading method thereof and more particularly, to a resistive memory apparatus and a reading method thereof.

2. Description of Related Art

A nonvolatile memory is capable of saving stored data after the power is turned off and is thus an indispensable memory device for many electronic products to function properly. Currently, a resistive random access memory (RRAM) is a type of nonvolatile memory that is being actively developed in the industry, which has advantages of having a low voltage for write operation, spending a short time for writing and erasing, having a long memorizing time, performing non-destructive read operation, being capable of multi-state memory, having a simple structure and small required area. Consequently, RRAM has great potential in the applications in personal computers and electronic apparatuses in the future.

Generally, a resistive memory cell may change a width of a filament path according to a level and a polarity of an applied pulse voltage. Thereby, a resistance may be set as in a low-resistive state (LRS) or a high-resistive state (HRS) in a reversible and non-volatile manner, so as to represent storage data with different logic levels. For instance, when data of logic 1 is written, a RESET pulse may be applied to break the filament path, such that the high-resistive state is formed. When data of logic 0 is written, a SET pulse with an opposite polarity may be applied to reconstruct the filament path, such that the low-resistive state is formed. Thereby, during data reading, the data of logic 1 or of logic 0 may be read according to read currents generated in different resistive states.

However, the resistance of the low-resistive state usually tends toward being increased at a high temperature, while the resistance of the high-resistive state usually tends toward being reduced at the high temperature. Such situation that the resistances vary with the temperatures usually leads to difficulty in differentiating the low-resistive state from the high-resistive state.

SUMMARY

The invention provides a resistive memory apparatus and a reading method thereof, which can be used to read storage data of resistive memory cells correctly.

The reading method of the resistive memory apparatus of the invention includes: applying two reading pulses to a resistive memory cell to sequentially obtain a first reading resistance and a second reading resistance of the resistive memory cell at different temperatures; determining a resistive state of the second reading resistance according to values of the reading resistances and degrees of the temperatures corresponding to the reading resistances; and determining a logic level of storage data of the resistive memory cell according to the resistive state of the second reading resistance.

The resistive memory apparatus of the invention includes a resistive memory cell array, a thermoelectric device and a control unit. The resistive memory cell array includes a plurality of resistive memory cells. The thermoelectric device is coupled to the resistive memory cell array. The thermoelectric device is configured to adjust temperatures of the resistive memory cells according to an electrical pulse. The control unit is coupled to the thermoelectric device and the resistive memory cell array. The control unit applies two reading pulses one of the resistive memory cells to sequentially obtain first reading resistance and a second reading resistance of the resistive memory cell at different temperatures. The control unit determines a resistive state of the second reading resistance according to values of the reading resistances and degrees of the temperatures corresponding to the reading resistances. The control unit determines a logic level of storage data of the resistive memory cell according to the resistive state of the second reading resistance.

To sum up, in the resistive memory apparatus and the reading method thereof in the exemplary embodiments of the invention, the control unit determines the resistive states of the reading resistances according to the values of the reading resistances and the degrees of the temperatures corresponding to the reading resistances, such that the storage data of the resistive memory cells can be read correctly.

In order to make the aforementioned and other features and advantages of the invention more comprehensible, several embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Generally speaking, a resistive memory cell may form a high-resistive state to store data of, for example, logic 1 by applying a reset pulse, and form a low-resistive state to store data of, for example, logic 0 by applying a set pulse having a polarity opposite to the reset pulse. Thus, during a data reading operation, the resistive state may be distinguished according to reading currents corresponding to different resistive states, so as to correctly read the data of logic 1 or logic 0. However, a resistance of the low-resistive state tends toward being increased at a high temperature, and a resistance of the high-resistive state tends toward being reduced at the high temperature. Such situation that the resistances vary with the temperatures usually leads to difficulty in differentiating the low-resistive state from the high-resistive state.

The implementation of the resistive memory apparatus and the reading method provided by the embodiments of the invention will be described hereinafter.

Figure 1:
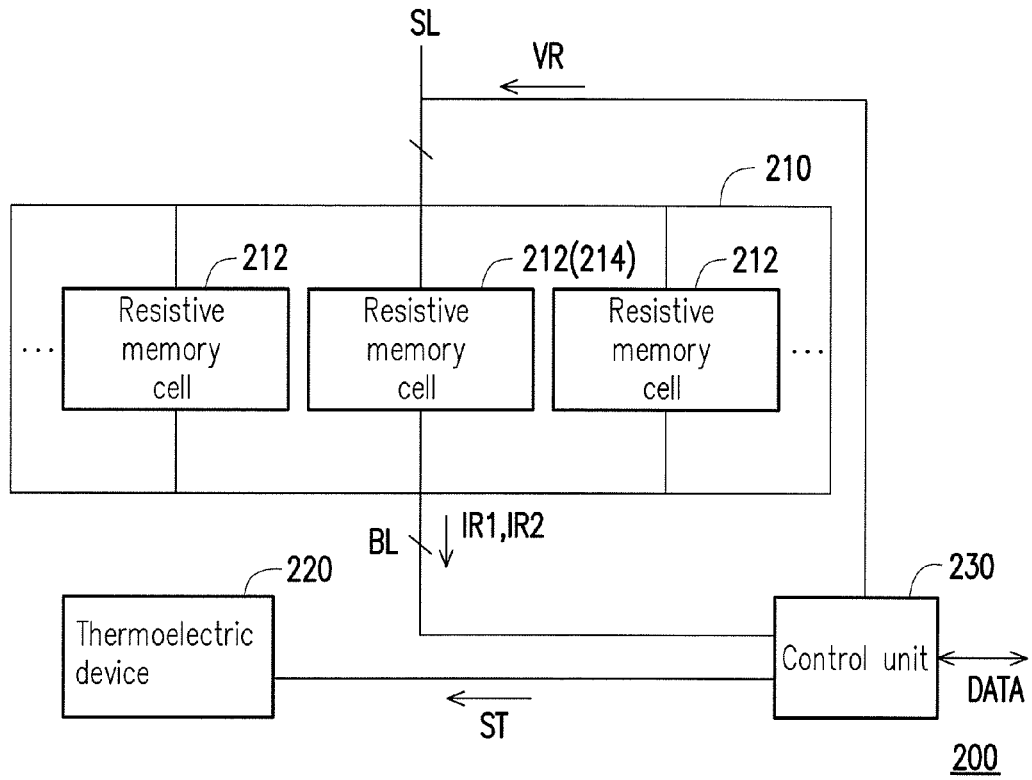
FIG. 1 is a schematic diagram illustrating a resistive memory apparatus according to an embodiment of the invention.

FIG. 1 is a schematic diagram illustrating a resistive memory apparatus according to an embodiment of the invention. Referring to FIG. 1, a resistive memory apparatus 200 includes a resistive memory cell array 210, a thermoelectric device 220 and a control unit 230. The resistive memory cell array 210 includes a plurality of resistive memory cells 212. The resistive memory cell array 210 is coupled to the control unit 230 via a plurality of bit lines BL and a plurality of source lines SL. Each of the resistive memory cells 212 may include a switch device, e.g., a metal oxide semiconductor field effect transistor (MOSFET) or a bipolar junction transistor (BJT) and a variable resistive element, and each of the resistive memory cells 212 may provide one-bit storage data.

During the data reading operation, the control unit 230 applies a read voltage VR to one of the resistive memory cells 212, e.g., a resistive memory cell 214 to generate a first read current IR1 at a first temperature. During the data reading operation, the control unit 230 again applies the read voltage VR to the resistive memory cell 214 to generate a second read current IR2 at a second temperature. In other words, during the data reading operation, the control unit 230 applies two pulses of the read voltage VR to the resistive memory cell 214 to sequentially obtain a first reading resistance and a second reading resistance of the resistive memory cell 214 at different temperatures.

In the present exemplary embodiment, the control unit 230, for example, outputs an electrical pulse ST to the thermoelectric device 220 to control the thermoelectric device 220 to adjust the temperatures of the resistive memory cell 214 according to the electrical pulse ST. In the present exemplary embodiment, the thermoelectric device 220 is, for example, a Peltier thermoelectric device or any other similar element, which is not limited in the invention.

The control unit 230 may be, for example, a central processing unit (CPU), a microprocessor, a digital signal processor (DSP), a programmable controller, a programmable logic device (PLD) or any other similar device or a combination of the devices. The control unit 230 is coupled to the resistive memory cell array 210 and the thermoelectric device 220.

An embodiment will be provided below to describe detailed steps of a data reading method of the resistive memory apparatus 200.

Figure 2:
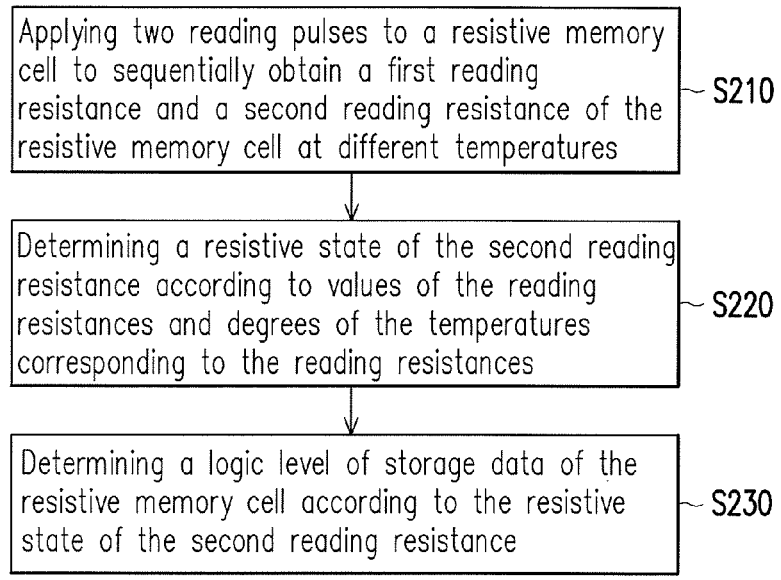
FIG. 2 is a flowchart illustrating a reading method of the resistive memory apparatus according to an embodiment of the invention.

FIG. 2 is a flowchart illustrating a reading method of the resistive memory apparatus according to an embodiment of the invention. Referring to both FIG. 1 and FIG. 2, the reading method for logic data of the present embodiment is at least adapted for, for example, the resistive memory apparatus 200 depicted in FIG. 1. Each step of the reading method of the embodiment of the invention will be described with reference to each element in the resistive memory apparatus 200 below.

In step S210, the control unit 230 applies two reading pulses to the resistive memory cell 214 to sequentially obtain the first reading resistance and the second reading resistance of the resistive memory cell 214 at different temperatures. In this step, after applying a first reading pulse to the resistive memory cell 214, the control unit 230 simultaneously determines the first temperature of the resistive memory cell 214. Meanwhile, the control unit 230 determines whether to raise or lower the temperatures of the resistive memory cell 214 according to a temperature threshold. Then, the control unit 230 further applies a second reading pulse to the resistive memory cell 214 to obtain the second reading resistance at the second temperature.

In step S220, the control unit 230 determines a resistive state of the second reading resistance according to values of the reading resistances and degrees of the temperatures corresponding to the reading resistances. For instance, in the present exemplary embodiment, if the second reading resistance is less than the first reading resistance (i.e., R2<R1), and the second temperature is greater than the first temperature (i.e., T2>T1), the control unit 230, for example, determines the resistive state of the second reading resistance as a first resistive state, e.g., a high-resistive state (HRS). If the second reading resistance is less than the first reading resistance (i.e., R2<R1), and the second temperature is less than the first temperature (i.e., T2<T1), the control unit 230, for example, determines the resistive state of the second reading resistance as a second resistive state, e.g., a low-resistive state (LRS). If the second reading resistance is greater than or equal to the first reading resistance (i.e., R2≥R1), and the second temperature is greater than the first temperature (i.e., T2>T1), the control unit 230, for example, determines the resistive state of the second reading resistance as the second resistive state. If the second reading resistance is greater than or equal to the first reading resistance (i.e., R2≥R1), and the second temperature is less than the first temperature (i.e., T2<T1), the control unit 230, for example, determines the resistive state of the second reading resistance as the first resistive state. However, the invention is not limited thereto.

In step S230, the control unit 230 determines a logic level of storage data of the resistive memory cell 214 according to the resistive state of the second reading resistance, so as to read the storage data of the resistive memory cell 214. For example, in an embodiment, the first resistive state of the second reading resistance may represent, for example, the storage of the data of logic 1, and the second resistive state of the second reading resistance may represent, for example, the storage of the data of logic 0. On the contrary, in other embodiments, the first resistive state of the second reading resistance may also represent, for example, the storage of the data of logic 0. In this example, the second resistive state of the second reading resistance represents, for example, the storage of the data of logic 1.

Thus, through the reading method of the embodiment of the invention, the control unit determines the resistive states of the reading resistances according to, for example, the values of the reading resistances and the degrees of the temperatures corresponding to the reading resistances, so as to correctly read the storage data of the resistive memory cells.

Figure 3:
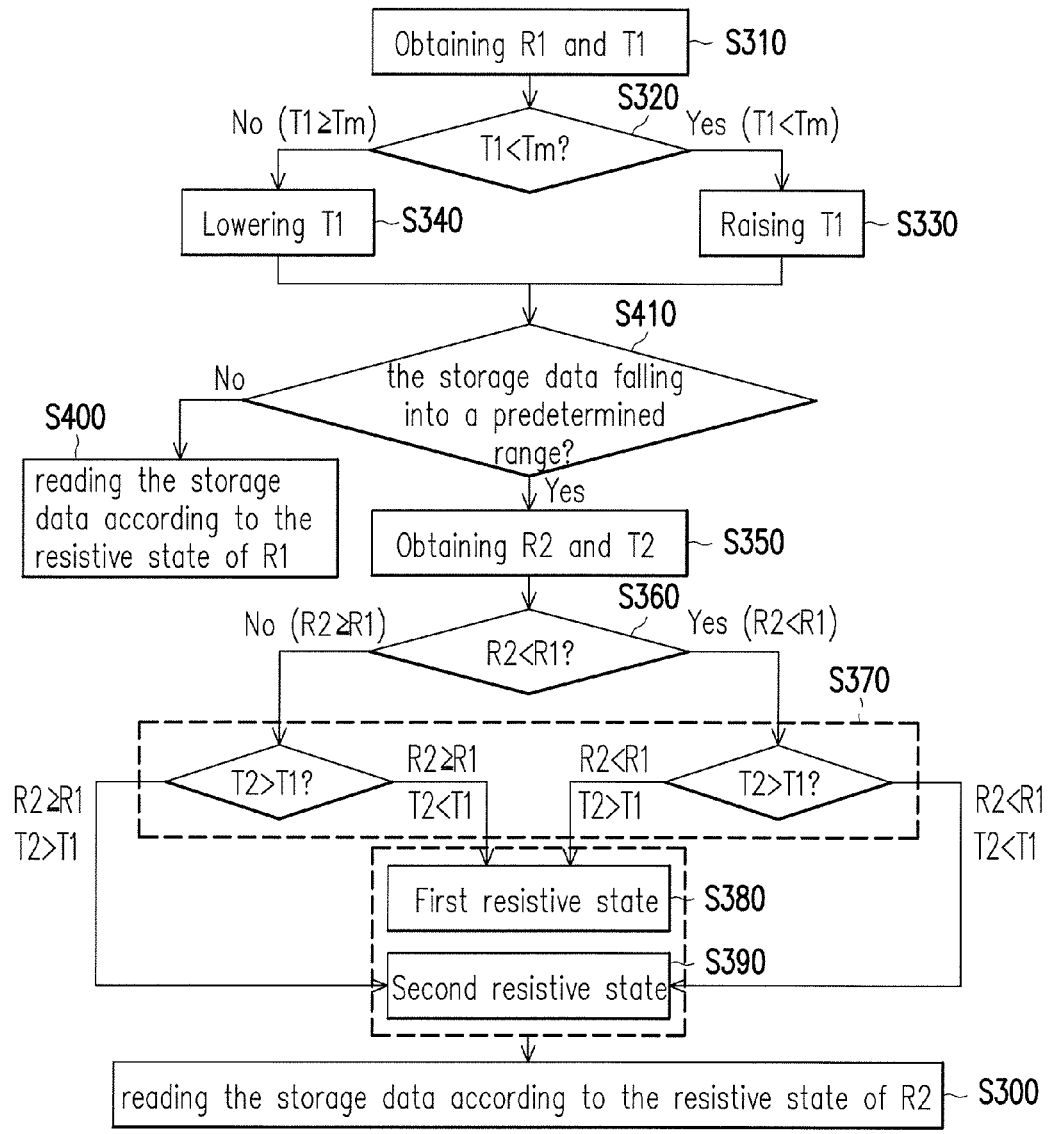
FIG. 3 is a flowchart illustrating a reading method of the resistive memory apparatus according to another embodiment of the invention.

FIG. 3 is a flowchart illustrating a reading method of the resistive memory apparatus according to another embodiment of the invention. Referring to both FIG. 1 and FIG. 3 simultaneously, the reading method for the logic data of the present embodiment is at least adapted for, for example, the resistive memory apparatus 200 depicted in FIG. 1. Each step of the reading method of the embodiment of the invention will be described with reference to each element in the resistive memory apparatus 200 below.

In step S310, the control unit 230 applies the reading pulse of the read voltage VR to the resistive memory cell 214 to sequentially obtain the first reading resistance of the resistive memory cell 214 at the first temperature, and determines the first temperature of the resistive memory cell 214. In step S320, the control unit 230 determines whether the first temperature is less than a temperature threshold. In the present exemplary embodiment, the temperature threshold is, for example, 150° C. or 85° C., which is not limited in the invention. If the first temperature is less than the temperature threshold (i.e., T1<Tm), the control unit 230 performs step S330. In step S330, the control unit 230 controls the thermoelectric device 220 by using an electrical signal ST, such that the thermoelectric device 220 raises the temperature of the resistive memory cell 214 according to the electrical signal ST. If the first temperature is greater than or equal to the temperature threshold (i.e., T1≥Tm), the control unit 230 performs step S340. In step S340, the control unit 230 controls the thermoelectric device 220 by using the electrical signal ST, such that the thermoelectric device 220 to lower the temperature of the resistive memory cell 214 according to the electrical signal ST.

After the temperature of the resistive memory cell 214 is lowered or raised, the control unit 230 reads the storage data of the resistive memory cell 214 according to the first reading resistance R1, and then determines whether the read storage data of the resistive memory cell 214 falls into a predetermined range, e.g. a range that the control unit 230 difficultly distinguishes the logic level according to the read storage data in step S410. If the logic level of the read storage data of the resistive memory cell 214 falls into the predetermined range, the control unit 230 further performs step S350. By contrast, if the read storage data of the resistive memory cell 214 does not fall into the predetermined range, the control unit 230 confirms the read storage data, and determines the logic level of the storage data of the resistive memory cell 214 according to the resistive state of the first reading resistance R1 in step S400.

In step S350, the control unit 230 applies the reading pulse of the read voltage VR to the resistive memory cell 214 to obtain the second reading resistance of the resistive memory cell 214 at the second temperature, and determines the second temperature of the resistive memory cell 214. Then, in step S360, the control unit 230 determines whether the second reading resistance is less than the first reading resistance. Thereafter, in step S370, the control unit 230 further determines whether the second temperature is greater than the first temperature.

In steps S360 and S370, through the determination, if the second reading resistance is less than the first reading resistance (i.e., R2<R1), and the second temperature is greater than the first temperature (i.e., T2>T1), the control unit 230 performs step S380 and determine the resistive state of the second reading resistance as the first resistive state, e.g., the high-resistive state (HRS). Through the determination, if the second reading resistance is less than the first reading resistance (i.e., R2<R1), the second temperature is less than the first temperature (i.e., T2<T1), the control unit 230 performs step S390 and determines the resistive state of the second reading resistance as the second resistive state, e.g., the low-resistive state (LRS).

In steps S360 and S370, through the determination, if the second reading resistance is greater than or equal to the first reading resistance (i.e., R2≥R1), and the second temperature is greater than the first temperature (i.e., T2>T1), the control unit 230 performs step S390 and determines the resistive state of the second reading resistance as the second resistive state. Through the determination, if the second reading resistance is greater than or equal to the first reading resistance (i.e., R2≥R1), and the second temperature is less than the first temperature (i.e., T2<T1), the control unit 230 performs step S390 and determines the resistive state of the second reading resistance as the first resistive state.

In step S300, the control unit 230 determines the logic level of the storage data of the resistive memory cell 214 according to the resistive state of the second reading resistance to read the storage data of the resistive memory cell 214.

Furthermore, enough teaching, suggestion, and implementation illustration for the reading method of the resistive memory apparatus of the embodiment of the invention may be obtained from the above exemplary embodiments depicted in FIG. 1 to FIG. 2, and thus related descriptions are not repeated hereinafter.

To summarize, in the resistive memory apparatus and the reading method thereof provided by the embodiments of the invention, the control unit determines the resistive states of the reading resistances according to the values of the reading resistances and the degrees of the temperatures corresponding to the reading resistances, such that the storage data of the resistive memory cells can be correctly read.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A reading method of a resistive memory apparatus, comprising:
    applying two reading pulses to a resistive memory cell to sequentially obtain a first reading resistance and a second reading resistance of the resistive memory cell at different temperatures;
    determining a resistive state of the second reading resistance according to values of the reading resistances and degrees of the temperatures corresponding to the reading resistances; and
    determining a logic level of storage data of the resistive memory cell according to the resistive state of the second reading resistance.

2. The reading method of the resistive memory apparatus according to claim 1, further comprising:
    between a step of obtaining the first reading resistance and a step of obtaining the second reading resistance, adjusting the temperatures of the resistive memory cell to obtain a first temperature corresponding to the first reading resistance and a second temperature corresponding to the second reading resistance.

3. The reading method of the resistive memory apparatus according to claim 2, wherein the step of adjusting the temperatures of the resistive memory cell comprises:
    determining whether the first temperature is less than a temperature threshold;
    if the first temperature is less than the temperature threshold, raising the temperatures of the resistive memory cell; and
    if the first temperature is greater than or equal to the temperature threshold, lowering the temperatures of the resistive memory cell.

4. The reading method of the resistive memory apparatus according to claim 2, wherein the step of determining the resistive state of the second reading resistance according to the values of the reading resistances and the degrees of the temperatures corresponding to the reading resistances comprises:
    determining whether the second reading resistance is less than the first reading resistance;
    if the second reading resistance is less than the first reading resistance, determining the resistive state of the second reading resistance as one of a first resistive state and a second resistive state; and
    if the second reading resistance is greater than or equal to the first reading resistance, determining the resistive state of the second reading resistance as the other one of the first resistive state and the second resistive state.

5. The reading method of the resistive memory apparatus according to claim 4, wherein the step of determining the resistive state of the second reading resistance according to the values of the reading resistances and the degrees of the temperatures corresponding to the reading resistances further comprises:
    determining whether the second temperature is greater than the first temperature;
    if the second reading resistance is less than the first reading resistance, and the second temperature is greater than the first temperature, determining the resistive state of the second reading resistance as the first resistive state; and if the second reading resistance is less than the first reading resistance, and the second temperature is less than the first temperature, determining the resistive state of the second reading resistance as the second resistive state.

6. The reading method of the resistive memory apparatus according to claim 4, wherein the step of determining the resistive state of the second reading resistance according to the values of the reading resistances and the degrees of the temperatures corresponding to the reading resistances further comprises:
determining whether the second temperature is greater than the first temperature;
if the second reading resistance is greater than or equal to the first reading resistance, and the second temperature is greater than the first temperature, determining the resistive state of the second reading resistance as the second resistive state; and
if the second reading resistance is greater than or equal to the first reading resistance, and the second temperature is less than the first temperature, determining the resistive state of the second reading resistance as the first resistive state.

7. The reading method of the resistive memory apparatus according to claim 1, further comprising:
between a step of obtaining the first reading resistance and a step of obtaining the second reading resistance, reading the storage data of the resistive memory cell according to the first reading resistance, and determining whether the storage data of the resistive memory cell falls into a predetermined range; and
if the storage data of the resistive memory cell falls into the predetermined range, performing the step of determining the resistive state of the second reading resistance according to the values of the reading resistances and the degrees of the temperatures corresponding to the reading resistances.

8. A resistive memory apparatus, comprising:
a resistive memory cell array, comprising a plurality of resistive memory cells;
a thermoelectric device, coupled to the resistive memory cell array and configured to adjust temperatures of the resistive memory cells according to an electrical pulse; and
a control unit, coupled to the thermoelectric device and the resistive memory cell array, applying two reading pulses to one of the resistive memory cells to sequentially obtain a first reading resistance and a second reading resistance of the resistive memory cell at different temperatures, determining a resistive state of the second reading resistance according to values of the reading resistances and degrees of the temperatures corresponding to the reading resistances, and determining a logic level of storage data of the resistive memory cell according to the resistive state of the second reading resistance.

9. The resistive memory apparatus according to claim 8, wherein between an operation of obtaining first reading resistance and an operation of obtaining the second reading resistance, the control unit outputs the electrical pulse to the thermoelectric device to control the thermoelectric device to adjust the temperatures of the resistive memory cell, such that the control unit obtains a first temperature corresponding to the first reading resistance and a second temperature corresponding to the second reading resistance.

10. The resistive memory apparatus according to claim 9, wherein when the control unit adjusts the temperatures of the resistive memory cell, the control unit determines whether the first temperature is less than a temperature threshold, the control unit controls the thermoelectric device to raise the temperatures of the resistive memory cell if the first temperature is less than the temperature threshold, and the control unit controls the thermoelectric device to lower the temperatures of the resistive memory cell if the first temperature is greater than or equal to the temperature threshold.

11. The resistive memory apparatus according to claim 9, wherein when the control unit determines the resistive state of the second reading resistance according to the values of the reading resistances and the degrees of the temperatures corresponding to the reading resistances, the control unit determines whether the second reading resistance is less than the first reading resistance, the control unit determines the resistive state of the second reading resistance as one of a first resistive state and a second resistive state if the second reading resistance is less than the first reading resistance, and the control unit determines the resistive state of the second reading resistance as the other one of the first resistive state and the second resistive state if the second reading resistance is greater than or equal to the first reading resistance.

12. The resistive memory apparatus according to claim 11, wherein when the control unit determines the resistive state of the second reading resistance according to the values of the reading resistances and the degrees of the temperatures corresponding to the reading resistances, the control unit further determines whether the second temperature is greater than the first temperature, the control unit determines the resistive state of the second reading resistance as the first resistive state if the second reading resistance is less than the first reading resistance, and the second temperature is greater than the first temperature, and the control unit determines the resistive state of the second reading resistance as the second resistive state if the second reading resistance is less than the first reading resistance, and the second temperature is less than the first temperature.

13. The resistive memory apparatus according to claim 11, wherein when the control unit determines the resistive state of the second reading resistance according to the values of the reading resistances and the degrees of the temperatures corresponding to the reading resistances, the control unit further determines whether the second temperature is greater than the first temperature, the control unit determines the resistive state of the second reading resistance as the second resistive state if the second reading resistance is greater than or equal to the first reading resistance, and the second temperature is greater than the first temperature, and the control unit determines the resistive state of the second reading resistance as the first resistive state if the second reading resistance is greater than or equal to the first reading resistance, and the second temperature is less than the first temperature.

14. The resistive memory apparatus according to claim 8, wherein between an operation of obtaining the first reading resistance and an operation of obtaining the second reading resistance, the control unit reads the storage data of the resistive memory cell according to the first reading resistance, the control unit determines whether the storage data of the resistive memory cell falls into a predetermined range, and if the storage data of the resistive memory cell falls into the predetermined range, the control unit determines the resistive state of the second reading resistance according to the values of the reading resistances and the degrees of the temperatures corresponding to the reading resistances.

* * * * *